(12) United States Patent
Cotton et al.

(10) Patent No.: US 8,895,864 B2
(45) Date of Patent: Nov. 25, 2014

(54) DEFORMABLE APPARATUS AND METHOD

(75) Inventors: Darryl Cotton, St. Ives (GB); Samiul Md Haque, Chesterton (GB); Piers Andrew, Cambridge (GB)

(73) Assignee: Nokia Corporation, Espoo (FI)

( * ) Notice: Subject to any disclaimer, the term of this patent is extended or adjusted under 35 U.S.C. 154(b) by 282 days.

(21) Appl. No.: 13/435,372

(22) Filed: Mar. 30, 2012

(65) Prior Publication Data

US 2013/0256004 A1 Oct. 3, 2013

(51) Int. Cl.
*H05K 3/20* (2006.01)
*H05K 1/00* (2006.01)

(52) U.S. Cl.
USPC .............................. 174/254; 29/831

(58) Field of Classification Search
USPC .................... 174/254; 361/749–751
See application file for complete search history.

(56) References Cited

U.S. PATENT DOCUMENTS

| 4,858,073 A | 8/1989 | Gregory | 361/388 |
| 6,275,361 B1 | 8/2001 | Wallash et al. | 360/323 |
| 6,403,892 B1* | 6/2002 | Feger et al. | 174/254 |
| 2001/0030060 A1* | 10/2001 | Carroll | 174/260 |
| 2010/0143848 A1 | 6/2010 | Jain et al. | 430/315 |

FOREIGN PATENT DOCUMENTS

| DE | 102007046639 A1 | 4/2009 |
| EP | 0044247 A1 | 1/1982 |
| EP | 1168897 A2 | 1/2002 |

OTHER PUBLICATIONS

Sun, Yugang, et al.; Adv. Mater. 2006, 18, 2857-2862: "Buckled and Wavy Ribbons of GaAs for High-Performance Electronics on Elastomeric Substrates".
Kim, Dae-Hyeong, et al.; Adv. Mater. 2008, 20, 1-6: "Stretchable Electronics: Materials Strategies and Devices".
Bossuyt, F., et al.; Microelectronics Reliability 51 (2011) 628-635: "Cyclic endurance reliability of stretchable electronic substrates".

* cited by examiner

*Primary Examiner* — Jeremy C Norris
(74) *Attorney, Agent, or Firm* — Harrington & Smith

(57) ABSTRACT

An apparatus and method wherein the apparatus includes a deformable substrate; a conductive portion; and at least one support configured to couple the conductive portion to the deformable substrate so that the conductive portion is spaced from the deformable substrate.

20 Claims, 6 Drawing Sheets

1

DEFORMABLE APPARATUS AND METHOD

TECHNOLOGICAL FIELD

Embodiments of the present disclosure relate to a deformable apparatus and method. In particular, they relate to a deformable apparatus and method which may be configured for use within an apparatus such as an electronic apparatus.

BACKGROUND

Electronic apparatus such as cellular telephones, gaming device or cameras are known. Such apparatus may be bendable or stretchable, that is they may be configured to be deformed in response to a force applied by a user of the apparatus 1.

In such apparatus it is beneficial to configure electronic components and connections between the components so that they are not damaged when the apparatus is deformed.

BRIEF SUMMARY

According to various, but not necessarily all, embodiments of the disclosure there is provided an apparatus comprising: a deformable substrate; a conductive portion; and at least one support configured to couple the conductive portion to the deformable substrate so that the conductive portion is spaced from the deformable substrate.

In some embodiments the conductive portion may be curved. A radius of curvature of the conductive portion may be parallel to a plane of the deformable substrate.

In some embodiments the conductive portion may comprise at least one deformable portion.

In some embodiments the conductive portion may comprise at least one rigid portion.

In some embodiments the conductive portion may comprise a wire.

In some embodiments the conductive portion may comprise a plurality of wires.

In some embodiments the conductive portion may comprise a flexible printed circuit board.

In some embodiments the deformable substrate may be configured to be deformed in response to a force applied by a user. Deforming the deformable substrate may comprise bending at least a portion of the deformable substrate. Deforming the deformable substrate may comprise stretching at least a portion of the deformable substrate.

In some embodiments the apparatus may also comprise a further deformable substrate and the further deformable substrate may be arranged on an opposite side of the conductive portion to the deformable substrate.

In some embodiments the apparatus may comprise a plurality of supports.

In some embodiments the conductive portion may be coupled to the at least one support at a plurality of different points.

According to various, but not necessarily all, embodiments of the disclosure there is provided a method comprising: coupling a conductive portion to a deformable substrate using at least one support such that the conductive portion is spaced from the deformable substrate.

In some embodiments the conductive portion may be curved. In some embodiments the method may comprise coupling the conductive portion to the deformable substrate such that a radius of curvature of the conductive portion is parallel to a plane of the deformable substrate.

In some embodiments the conductive portion may comprise at least one deformable portion.

In some embodiments the conductive portion may comprise at least one rigid portion.

In some embodiments the conductive portion may comprise a wire.

In some embodiments the conductive portion may comprise a plurality of wires.

In some embodiments the conductive portion may comprise a flexible printed circuit board.

In some embodiments the deformable substrate may be configured to be deformed in response to a force applied by a user.

In some embodiments deforming the deformable substrate may comprise bending at least a portion of the deformable substrate.

In some embodiments deforming the deformable substrate may comprise stretching at least a portion of the deformable substrate.

In some embodiments the method may further comprise configuring a further deformable substrate on an opposite side of the conductive portion to the deformable substrate.

In some embodiments the method may further comprise configuring a plurality of supports to be coupled to the conductive portion.

In some embodiments the conductive portion may be coupled to the at least one support at a plurality of different points.

The apparatus may be for use in an electronic apparatus such as a mobile telephone or other wireless communications device.

BRIEF DESCRIPTION

For a better understanding of various examples of embodiments of the present disclosure reference will now be made by way of example only to the accompanying drawings in which:

FIG. 1 schematically illustrates an apparatus 1 according to an examplary embodiment of the disclosure;

DETAILED DESCRIPTION

The Figures illustrate an apparatus 1 comprising: a deformable substrate 3; a conductive portion 7; and at least one support 5 configured to couple the conductive portion 7 to the deformable substrate 3 so that the conductive portion 7 is spaced from the deformable substrate 3.

Figure 1:
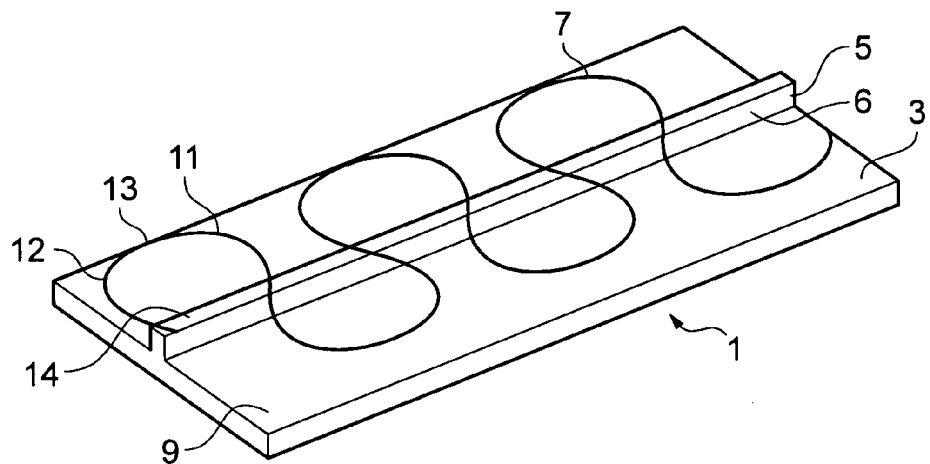

FIG. 1 schematically illustrates an apparatus 1 according to an examplary embodiment of the disclosure. The apparatus 1 illustrated in FIG. 1 comprises a deformable substrate 3, at least one support 5 and a conductive portion 7. Only features relevant to the following description have been illustrated in FIG. 1. It is to be appreciated that in other embodiments of the disclosure other features may be included. For example the apparatus 1 may be configured to be located within a larger electronic apparatus 1 such as mobile cellular telephone or gaming device, for example. In such embodiments the apparatus 1 may comprise means for coupling the apparatus 1 illustrated in FIG. 1 to the rest of the electronic apparatus.

In the examplary embodiment illustrated in FIG. 1 the deformable substrate 3 comprises a planar surface 9. In the embodiment of FIG. 1 the planar surface 9 is flat or substantially flat. In other embodiments of the disclosure the deformable substrate 3 may have a different shape. For example it may be curved and/or the surface 9 of the deformable substrate 3 need not be flat.

The equilibrium shape of the deformable substrate may be the flat configuration illustrated in FIG. 1. The equilibrium shape is the position and shape which the deformable substrate 3 will adopt when no external force is applied by the user of the apparatus 1. In other embodiments of the disclosure the deformable substrate 3 may have a different equilibrium shape, for example, the equilibrium shape may comprise at least a part of the deformable substrate 3 being bent or curved. In some embodiments the deformable substrate 3 may comprise both flat and curved portions.

The deformable substrate 3 may comprise at least one user-deformable portion which may be configured to change shape in response to a physical force applied by a user of the apparatus 1. The change in shape may comprise bending, folding, twisting, stretching, compression, shearing or any other suitable deformation of a portion of the deformable substrate 3. The deformable substrate 3 may be configured to automatically return to its equilibrium shape when the force applied by the user is removed.

In some embodiments of the disclosure the deformable substrate 3 may comprise a flexible substrate which may be bent or twisted by a user. The deformable substrate 3 may comprise a polymer material, elastomeric material or any other material which may be deformed in response to a force applied by the user of the apparatus 1.

In other embodiments the deformable substrate 3 may comprise a plurality of hinged or jointed segments. The hinged or jointed segments may be configured to be moved with respect to each other to enable a portion of the deformable substrate 3 to be folded or bent or stretched. The deformable substrate 3 may be folded or bent or stretched in response to a force applied by the user of the apparatus 1.

In some embodiments of the disclosure one or more electronic components may be mounted on deformable substrate 3.

The apparatus 1 illustrated in FIG. 1 also comprises at least one support 5. The support may comprise any means which may be configured to support a conductive portion 7 in a position spaced from the deformable substrate 3. In the examplary embodiment of FIG. 1 the at least one support 5 extends in a direction perpendicular to the planar surface 9 of the deformable substrate 3.

In the examplary embodiment illustrated in FIG. 1 the at least one support 5 comprises a beam 6 which extends along a portion of the planar surface 9 of the deformable substrate 3. It is to be appreciated that other types of support may be used in other embodiments of the disclosure. For example, in other embodiments the at least one support 5 may comprise a plurality of individual supports which are located separated from each other on the surface 9 of the deformable substrate 3. The plurality of individual supports may be any suitable size or shape for example, the individual supports may be square or rectangular or cylindrical or any other suitable shape. In some embodiments of the disclosure different individual supports may have different sizes and/or shapes.

In some embodiments of the disclosure the at least one support 5 may be configured to be deformable in response to a force applied by a user. For example the at least one support 5 may be configured to bend or stretch or be compressed or any other suitable deformation in response to a force applied by a user. In other embodiments of the disclosure the at least one support may be configured so that it is not deformable in response to a force applied by a user. For example, the at least one support 5 may comprise a rigid material so that the at least one support 5 is not compressed when a force is applied by a user.

The at least one support 5 may be coupled to the deformable substrate 3 so that if the deformable substrate 3 is deformed this also causes movement of the at least one support 5 from its equilibrium position. For example, in the examplary embodiment illustrated in FIG. 1 the support 5 comprises a beam 6 which is mounted on the deformable substrate 3 so that it extends along a portion of the planar surface 9 of the deformable substrate 3. If the portion of the deformable substrate 3 on which the beam 6 is mounted is deformed then the beam 6 is also deformed. The deformable substrate 3 may be deformed by being stretched, twisted or bent for example so the beam 6 may also be stretched, twisted or bent. In such embodiments the beam 6 may comprise a flexible material such as polymeric material, elastomeric material or any other material which may be deformed in response to a force applied by the user of the apparatus 1 but which is rigid enough to support the conductive portion 7.

As mentioned above, in other examplary embodiments the at least one support 5 may comprise a plurality of individual supports which are located separated from each other on the surface 9 of the deformable substrate 3 rather than a continuous beam. In such embodiments deforming a portion of the deformable substrate 3 will cause changing the positions or relative orientations of the respective supports 5 and need not cause a deformation of an individual support. In such embodiments of the disclosure the supports 5 may be made of any suitable material which may be configured to support the conductive portion 7.

The apparatus 1 illustrated in FIG. 1 also comprises a conductive portion 7. The conductive portion may comprise a wire or a plurality of wires. In some embodiments of the disclosure the conductive portion 7 may comprise a flexible printed circuit board. The flexible printed circuit board may comprise a multi-layered flexible printed circuit board.

In the examplary embodiments the conductive portion 7 may be coupled to the deformable substrate 3 via the at least one support 5. In the examplary embodiment illustrated in FIG. 1 the at least one support 5 is positioned between the conductive portion 7 and the deformable substrate 3. The at least one support 5 may maintain the conductive portion 7 in a position which is spaced from the deformable substrate 3 so that the conductive portion 7 and the deformable substrate 3 are separated from each other. The distance of the separation between the conductive portion 7 and the deformable substrate 3 may be dependent on the height of the at least one support 5. In the examplary embodiment of FIG. 1 the distance of the separation between the conductive portion 7 and the deformable substrate 3 is the same as the height of the beam 6.

In some embodiments of the disclosure the conductive portion 7 and the at least one support 5 may be configured so that the conductive portion 7 does not directly contact the deformable substrate 3. In some embodiments of the disclosure the conductive portion 7 and the at least one support 5 may be configured so that the conductive portion 7 does not directly contact the deformable substrate 3 when the apparatus 1 is in an equilibrium, non-deformed state. In some embodiments of the disclosure the conductive portion 7 and the at least one support 5 may be configured so that the conductive portion 7 does not directly contact the deformable substrate 3 when the apparatus 1 is in a deformed state.

In the examplary embodiment of FIG. 1 the conductive portion 7 comprises an elongate member 11 which is coupled to the at least one support 5 at a plurality of different points along the length of the elongate member 11.

In the examplary embodiment of FIG. 1 the elongate member 11 is curved. The total length of the elongate member 11 is greater than the length of the deformable substrate 3 over which the elongate member 11 extends. The curved portion of the elongate member 11 has an angle of curvature greater than 180 degrees so that the elongate member 11 doubles back on itself to form a loop 12. The loop 12 comprises an opening 14 so the loop 12 is not closed. In the examplary embodiment of FIG. 1 the elongate member 11 comprises a plurality of loops 12. The plurality of loops 12 form a serpentine shape in which serpentine shape in which a loop 12 which extends to the left hand side of the beam 6 is followed by a loop 12 which extends to the right hand side of the beam 6. The elongate member 11 is configured so that the conductive portion 7 is distributed on either side of the beam 6.

The conductive portion 7 may be coupled to the at least one support 5 at a plurality of different points along the length of the elongate member 11. In the examplary embodiment of FIG. 1 the conductive portion 7 is coupled to the beam 6 at two points in each loop 12.

It is to be appreciated that the shape of the conductive portion 7 illustrated in FIG. 1 is an example and other shapes could be used in other embodiments of the disclosure.

Figure 2:
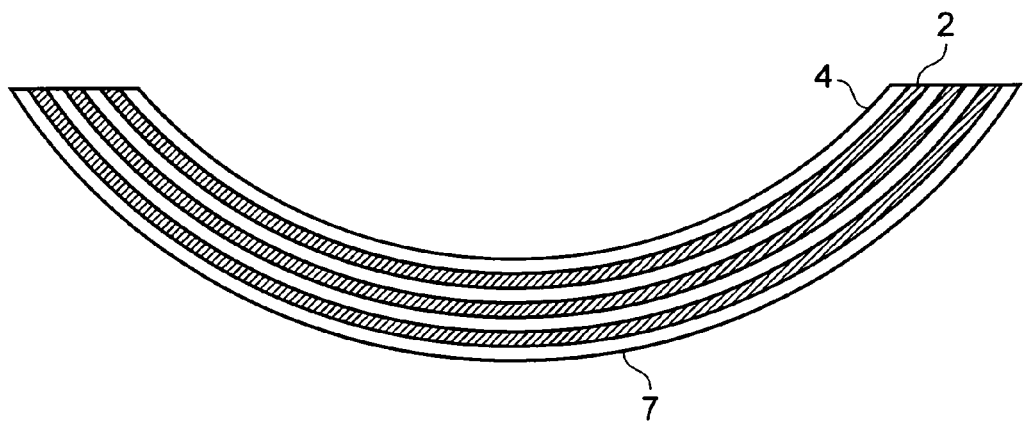
FIG. 2 illustrates a first conductive portion 7 according to another examplary embodiment of the disclosure.

For instance, an examplary embodiment in which the conductive portion 7 comprises a flexible printed circuit board is illustrated in FIG. 2. The flexible printed circuit board may comprise at least one conductive element 2 mounted on a flexible substrate 4. A plurality of conductive elements 2 may be provided on the flexible substrate 4. In the examplary embodiment illustrated in FIG. 2 the flexible printed circuit board comprises three conductive elements 2. The plurality of conductive elements 2 may extend along a length of the flexible printed circuit board. In the embodiment of the disclosure illustrated in FIG. 2 the plurality of conductive elements 2 extend along a length of the flexible printed circuit board in parallel to each other so that the distance between the respective conductive elements 2 remains constant. It is to be appreciated that other arrangements of the conductive elements 2 may be used in other implementations of the embodiments of the disclosure. For example, in some embodiments of the disclosure the flexible circuit board may be a multi-layered flexible circuit board comprising a plurality of conductive portions stacked on top of each other.

The conductive elements 2 may comprise any suitable material which enables the conductive elements 2 to conduct an electrical signal. For example the conductive elements 2 may comprise a metal such as copper or gold or silver or any other suitable material.

In some embodiments of the disclosure the flexible substrate 4 may comprise an insulating material. The insulating material may be configured to prevent electrical signals being transmitted between the conductive elements 2. For example the flexible substrate 4 may comprise an elastomer such as polyurethane or any other suitable material.

Figure 3:
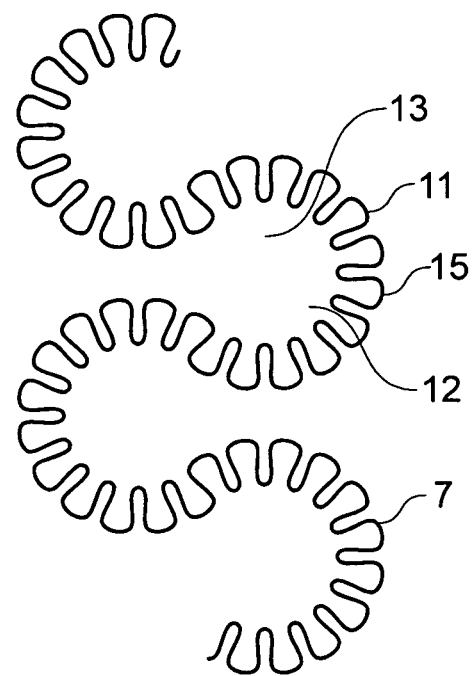
FIG. 3 illustrates a second conductive portion 7 according to another examplary embodiment of the disclosure.

As another example FIG. 3 illustrates a conductive portion 7 which could be used in other examplary embodiments of the disclosure. In this examplary embodiment the conductive portion 7 also comprises an elongate member 11. The elongate member 11 comprises a plurality of curved portions 13 where each curved portion 13 curves through an angle greater than 180 degrees so that the elongate member 11 doubles back on itself and forms a loop 12. The plurality of loops 12 of the conductive portion 7 in FIG. 3 also form a serpentine shape in which serpentine shape in which a loop 12 which extends to the left hand side is followed by a loop 12 which extends to the right hand side. However in the examplary embodiment illustrated in FIG. 3 the loops 12 of the conductive portion 7 comprise a plurality of smaller loops 15. In the particular embodiment of FIG. 3 the smaller loops 15 are also configured to form serpentine shape in which a small loop 15 which extends to the left hand side is followed by a small loop 15 which extends to the right hand side. It is to be appreciated that other shapes or configurations of the conductive portion 7 could be used in other embodiments of the disclosure.

Figure 4:
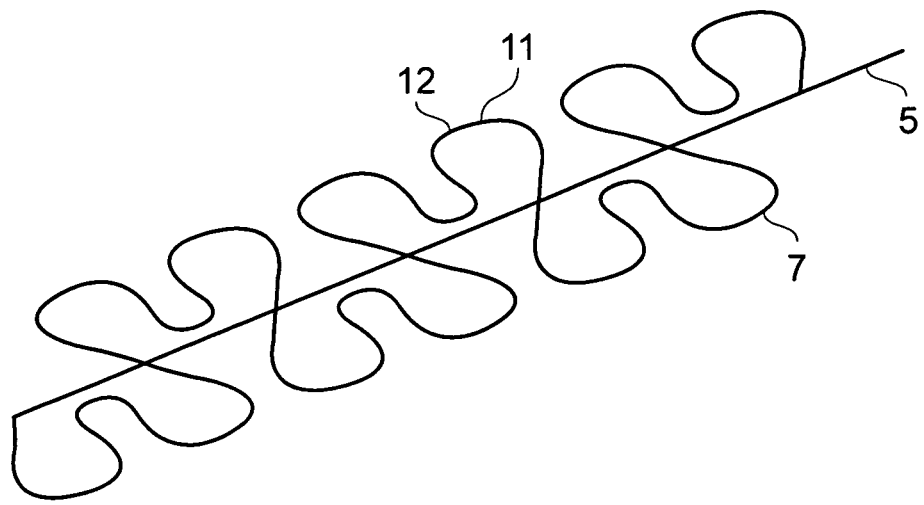
FIG. 4 illustrates a third conductive portion 7 according to another examplary embodiment of the disclosure.

As a further example FIG. 4 illustrates another conductive portion 7 which could be used in other examplary embodiments of the disclosure. In this examplary embodiment the conductive portion 7 also comprises an elongate member 11. The elongate member 11 comprises a plurality of curved portions 13 where each curved portion 13 curves through an angle greater than 180 degrees so that the elongate member 11 doubles back on itself and forms a loop 12. The plurality of loops 12 in the embodiment illustrated in FIG. 4 comprise a triple loop configuration in which a large loop 12 which extends to the left hand side is followed by a smaller loop 12 which extends to the right hand side and then another large loop 12 which extends to the left hand side. This is then followed by a triple loop configuration to the other side in which a large loop 12 which extends to the right hand side is followed by a smaller loop 12 which extends to the left hand side and then another large loop 12 which extends to the right hand side. In the examplary embodiment illustrated in FIG. 4 this pattern is repeated along the length of the elongate member 11. In the examplary embodiment illustrated in FIG. 4 the loops are only attached to the at least one support 5 after every third loop so that there are a plurality of three loop segments with only two mounting points within the three loop segments. It is to be appreciated that other shapes or configurations of the conductive portion 7 could be used in other embodiments of the disclosure.

In the examplary embodiments of FIG. 1 the conductive portion 7 is mounted on the at least one support 5 so that elongate member 11 of the conductive portion 7 extends in a plane parallel to the planar surface 9 of the deformable substrate 3. The radius of curvature of the curved portions 13 of the conductive portion extends in a direction parallel to the deformable substrate 3 when the apparatus 1 is in an equilibrium state. It is to be appreciated that if the apparatus 1 is deformed out of the equilibrium shape illustrated in FIG. 1 the deformable substrate 3 may no longer be flat and the conductive portion 7 might not be parallel with the deformable substrate 3 when it is in such a configuration.

Embodiments of the disclosure as described above provide a deformable apparatus 1. As the conductive portion 7 is coupled to the deformable substrate 3 via the at least one support 5 this enables the conductive portion 7 to be positioned spaced from the deformable substrate 3. When a user applies a force to the deformable substrate 3 this may cause a change in size or shape of the deformable substrate 3. As the conductive portion 7 is not directly coupled to the deformable substrate 3 the forces applied to the deformable substrate are not also applied to the conductive portion 7. This means that the conductive portion does not bend or change size or shape in the same way that the deformable substrate does. This may reduce the amount of stress within the conductive portion 7 and reduce the likelihood of failure due to fatigue.

In some embodiments of the disclosure there may be some deformation of the conductive portion 7 when the deformable substrate 3 is deformed. For example, if the deformable substrate 3 is stretched this will also cause the beam to be stretch and increase the distance between two points within the beam 6. This will therefore cause an increase in the distance between the points of the conductive portion 7 which are coupled to the beam 6. The shape and configuration of the conductive portion 7 may be chosen to reduce the amount of stress within the conductive portion 7. The shape chosen may depend on a plurality of different factors including, the magnitude and direction of forces likely to be applied to the apparatus 1, the physical properties of the conductive portion 7 such as the Young's modulus and the tensile strength, the fatigue life, the expected deformations of the deformable substrate 3, the height of the at least one support 5 and any other suitable factor. The width of the conductive portion 7 may vary along the length of the conductive portion 7. The variation in width may be chosen to reduce the localisation of stress within the conductive portion 7 and enable a more even distribution of the strain within the conductive portion 7.

In the illustrated embodiment the loops 12 and curved portions 13 may form sections of circles. The radius of curvature of these sections, and the height of these sections, or distance they extend from the beam 6, may be selected so as to reduce the stress within the conductive portion 7 and enable lower strain within the conductive portion 7 when the deformable substrate 3 is deformed. Other shapes and configurations may be used in other embodiments of the disclosure.

Embodiments of the disclosure may be used in radio frequency devices such as antennas or transmission lines.

Figure 5:
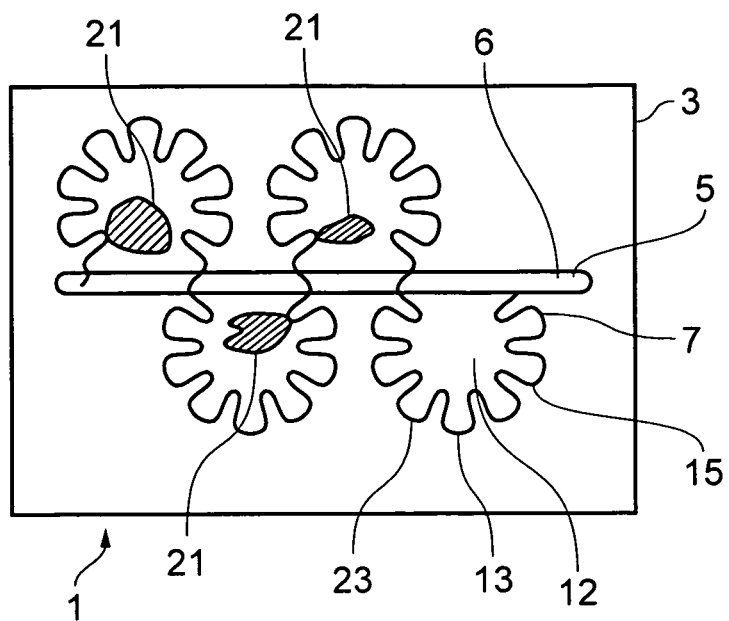
FIG. 5 illustrates a plan view of an apparatus 1 according to a further examplary embodiment of the disclosure.

FIG. 5 illustrates a plan view of an apparatus 1 according to a further embodiment of the disclosure. The apparatus 1 of this embodiment comprises a deformable substrate 3 and at least one support 5 comprising a beam 6 as described above in relation to FIG. 1. The apparatus 1 also comprises a conductive portion 7 coupled to the deformable substrate via the beam 6 in a similar manner to that of the apparatus 1 of FIG. 1.

The conductive portion 7 illustrated in FIG. 5 is similar to the conductive portion illustrated in FIG. 3 in that it comprises a plurality of small loops 15 within larger loops 12 to create a serpentine configuration within a serpentine configuration.

The conductive portion 7 illustrated in FIG. 5 comprises user deformable portions 23. The user deformable portions 23 may comprise portions of the conductive portion 7 which may be deformed when a user applies a force to the apparatus 1. For example, the user deformable portions 23 may be stretched or bent or twisted or any other suitable change in shape when a user applies a force to the apparatus 1.

In the examplary embodiment of FIG. 5 the user deformable portions 23 comprise the curved portions 13 of the conductive portion 7. When a force is applied to the apparatus 1 this may cause a change in shape of the curved portions, for example it may cause a change in the radius of curvature.

The user deformable portions 23 may comprise a material which is flexible enough to allow the shape of the user deformable portions 23 to change when a force is applied. In some embodiments of the disclosure the conductive portion 7 may comprise copper, gold, silver, graphene, carbon nanotubes or any other suitable conductive material.

The conductive portion 7 illustrated in FIG. 5 also comprises rigid portions 21. In the specific example of FIG. 5 a plurality of rigid portions 21 are provided. The rigid portions 21 may comprise portions of the conductive portion 7 which do not change shape when a force is applied to the apparatus 1. The rigid portions 21 may comprise part of the conductive portion and need not be directly coupled to the at least one support 5 or the deformable substrate 3.

The rigid portions 21 may be configured to enable electronic components to be mounted on the rigid portions 21. The electronic components mounted on the rigid portions 21 may comprise sensitive components or components which are likely to be damaged if they were to undergo deformation. For example, the components may comprise transistors, integrated circuits or sensors or any other type of components.

In some embodiments the rigid portions 21 may comprise a material such as copper or other metallic material. In some embodiments the rigid portions 21 may comprise non-metallic materials such as silicon, polyethylene terephthalate (PET), polyimide or any other suitable material. In some embodiments of the disclosure the rigid portions may be portions within a printed circuit board.

Embodiments of the disclosure as illustrated in FIG. 5 and described above provide further benefits in that the rigid portions 21 of the conductive portion 7 enable sensitive components to be mounted on the conductive portion 7. These act to protect the components mounted on the rigid portion 21. When the apparatus 1 is deformed the rigid portions 21 of the conductive portion 7 are not directly coupled to the deformable substrate 3 and do not deform with the deformable substrate 3. As the conductive portion 7 comprises deformable portions 23, if the deformable substrate 3 is deformed in a manner that causes the conductive portion 7 to be deformed then the deformable portions 23 of the conductive portion 7 will be deformed rather than the rigid portions 21 which provides further protection on the components mounted on the rigid portion 21.

Figure 6:
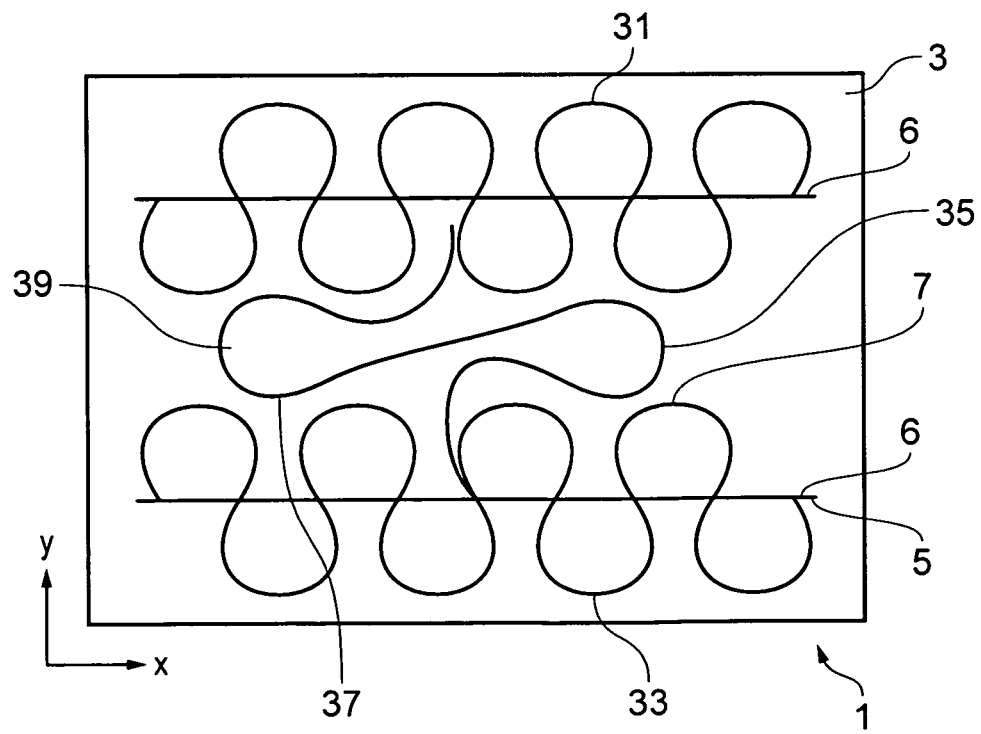
FIG. 6 illustrates a plan view of an apparatus 1 according to another examplary embodiment of the disclosure.

FIG. 6 illustrates a plan view of an apparatus 1 according to a further embodiment of the disclosure. The apparatus 1 of this embodiment also comprises a deformable substrate 3 as described above in relation to FIGS. 1 and 5.

In the embodiment illustrated in FIG. 6 the apparatus 1 comprises two supports 5. Each of the supports 5 comprises a beam 6. In the examplary embodiment of FIG. 6 the two beams 6 are positioned on the surface 9 of the deformable substrate 3 so that they extend parallel to each other. The beams 6 extend in a first direction, indicated by arrow x in FIG. 6. The beams 6 are separated from each other in a direction perpendicular to the x direction, as indicated by the arrow y in FIG. 6.

In the embodiment illustrated in FIG. 6 the apparatus 1 also comprises a conductive portion 7. The conductive portion 7 may be conductive portion 7 as described above in relation to FIGS. 1, to 5. The conductive portion 7 is coupled to the deformable substrate 3 via both of the beams 6 in a similar manner to that of the apparatus 1 illustrated in FIG. 1.

In the embodiment of FIG. 6 the conductive portion 7 comprises a first serpentine portion 31 which extends along a first beam 6 in the x direction. The conductive portion 7 also comprises a second serpentine portion 33 which extends along the second beam 6 also in the x direction.

The two serpentine portions 31, 33 are connected together by an intermediary portion 35 which extends between the two beams 6 in the y direction. In the examplary embodiment of FIG. 6 the intermediary portion 35 also comprises curved portions 37 which double back on themselves to form loops 39.

It is to be appreciated that the shape of the conductive portion illustrated in FIG. 6 is examplary and that other shapes and configurations could be used in other embodiments of the disclosure.

Embodiments of the disclosure as illustrated in FIG. 6 and described above provide further benefits in that they provide a deformable apparatus 1 having a conductive portion 7 which is configured to extend in two directions across a surface. This enables the deformable substrate 3 to be deformed in different directions without placing too much strain on the conductive portion 7.

Figure 7A:
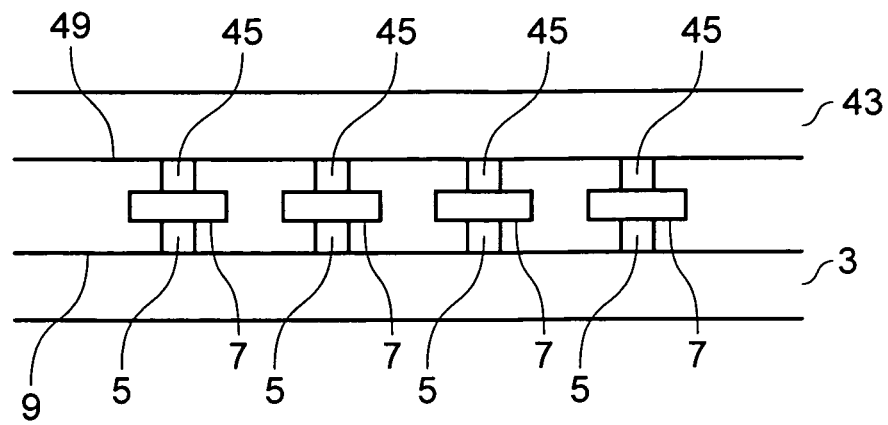
FIGS. 7A and 7B illustrate cross sections through an apparatus 1 according to another exemplary embodiment of the disclosure.
Figure 7B:
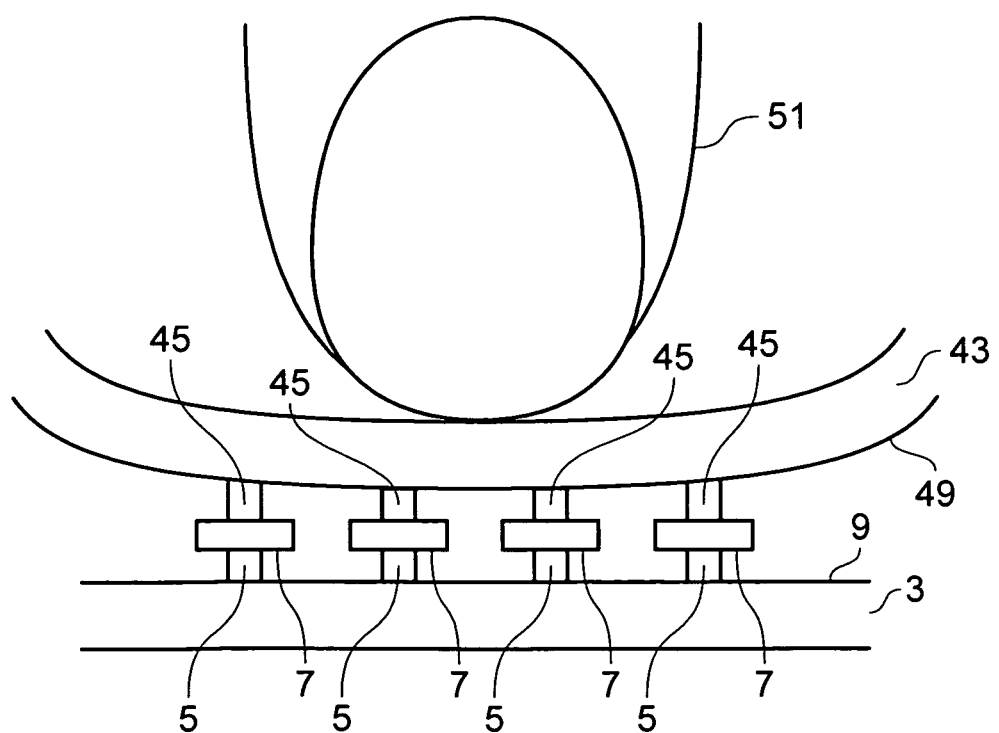

FIGS. 7A and 7B illustrates cross sections through an apparatus 1 according to further examplary embodiments of the disclosure. FIG. 7A illustrates the apparatus 1 in an equilibrium state in which no external force is applied to the apparatus 1. FIG. 7B illustrates the same apparatus 1 in a deformed state in which a force is applied to the apparatus 1 by a user.

In FIGS. 7A and 7B the apparatus 1 comprises a deformable first substrate 3 as described above in relation to FIG. 1.

The examplary apparatus 1 of FIGS. 7A and 7B also comprises a plurality of supports 5 spaced along the surface of the deformable substrate 3. In the examplary embodiment of FIGS. 7A and 7B the plurality of supports 5 may comprise a plurality of beams which extend into the page and so are illustrated in cross section. In other embodiments of the disclosure a plurality of individual supports 5 may be provided rather than one or more beams.

The examplary apparatus of FIGS. 7A and 7B also comprises a conductive portion 7. The conductive portion 7 may comprise a serpentine shape as described above in relation to FIG. 1. As the apparatus 1 is illustrated in cross section in FIGS. 7A and 7B, only the portions of the conductive portion 7 which are coupled to the supports 5 are illustrated.

The apparatus 1 illustrated in FIGS. 7A and 7B also comprises a further substrate 43. The further substrate 43 is arranged on the opposite side of the conductive portion 7 to the deformable first substrate 3. The further substrate 43 may also comprise a planar surface 49. The further substrate 43 may be positioned relative to the first substrate 3 so that the surface 9 of the first substrate 3 and the surface 49 of the further substrate 43 are parallel to each other when the apparatus 1 is in the equilibrium position illustrated in FIG. 7A. It is to be appreciated that other configurations may be used for an equilibrium position in other embodiments of the disclosure.

In the examplary embodiment illustrated in FIGS. 7A and 7B the further substrate 43 is positioned within the apparatus 1 so that it is spaced from the conductive portion 7. In the particular examplary embodiment of FIGS. 7A and 7B the further substrate 43 is maintained in a position spaced from the deformable substrate 3 by further supports 45. The further supports 45 extend out of the surface 49 of the further substrate 43. The further supports 45 may extend in a direction perpendicular to the surface 49 of the further substrate 43. The further supports 45 may extend in a direction toward the first substrate 3.

The further supports 45 may provide means for coupling the conductive portion 7 to the further substrate 43.

The further substrate 43 may also be deformable so the further substrate 43 may comprise at least one user-deformable portion which may be configured to change shape in response to a physical force applied by a user of the apparatus 1. The change in shape may comprise bending, folding, twisting, stretching, compression, shearing or any other suitable deformation of a portion of the deformable substrate 3. The further substrate 45 may be configured to automatically return to its equilibrium shape when the force applied by the user is removed.

In FIG. 7B a user has applied a force to the further substrate 43. The user is pushing with their finger 51 in a direction perpendicular to the surface 49 of the further substrate 43. This has caused some deformation of the further substrate 43. In particular this has caused the further substrate 43 to bend.

In the examplary embodiment of FIG. 7B the force applied by the user has also caused the further supports 45 to be deformed. In particular the further supports 45 have been compressed which has reduced the separation between the conductive portion 7 and the further substrate 49. In the examplary embodiment illustrated in FIG. 7B the supports 5 have also been compressed.

Embodiments of the disclosure as illustrated in FIGS. 7A and 7B provide the further benefit that the further substrate 43 protects the conductive portion when the user applies a force to the apparatus 1.

Figure 8A:
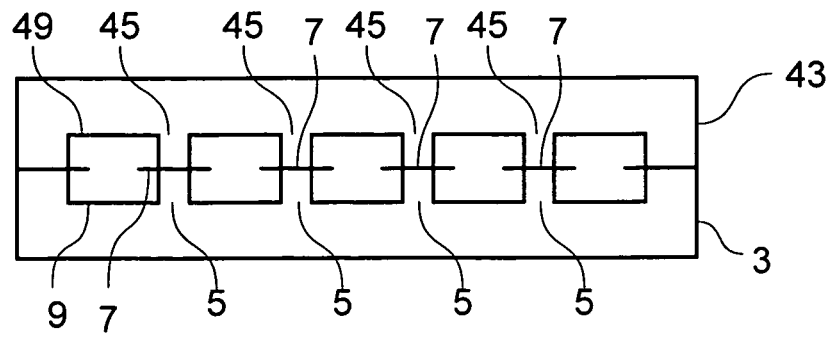
FIGS. 8A to 8C illustrate cross sections through another apparatus 1 according to another examplary embodiment of the disclosure.
Figure 8B:
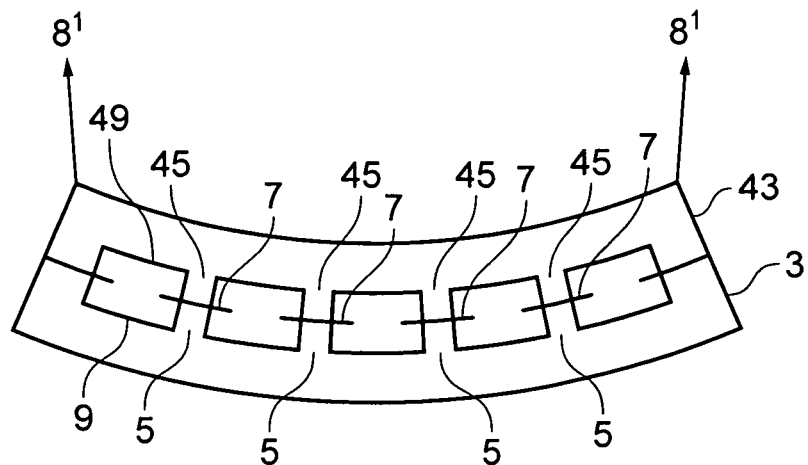

FIGS. 8A and 8B illustrate cross sections through an apparatus 1 according to further examplary embodiments of the disclosure. FIG. 8A illustrates the apparatus 1, as illustrated in FIG. 7A, in an equilibrium state in which no external force is applied to the apparatus 1. FIG. 8B illustrates the same apparatus 1 in a deformed state in which a force is applied to the apparatus 1 by a user. The deformed state illustrated in FIG. 8B is different to the deformed state illustrated in FIG. 7B.

In FIGS. 8A and 8B the apparatus 1 comprises a deformable first substrate 3, a plurality of supports 5 spaced along the surface of the deformable substrate 3 and a conductive portion 7 as described above in relation to FIGS. 7A and 7B. The examplary apparatus 1 of FIGS. 8A and 8B also comprises a further substrate 43 having a surface 49 and further supports 45, as described above in relation to FIGS. 7A and 7B.

In FIG. 8A the apparatus 1 is in an equilibrium state. In this examplary embodiment the apparatus 1 is flat when it is in the equilibrium state.

In FIG. 8B a user has applied a force to the apparatus 1. In the example of FIG. 8B the user has bent the apparatus 1 by applying a force which extends in an upward direction to each end of the apparatus 1 as indicated by the arrows 81. This has caused some deformation of the further substrate 43 and the substrate 3. In particular this has caused the further substrate 43 to bend so that the surface 49 is convex and the substrate 3 to bend so that the surface 9 is concave. It is to be appreciated that, in other embodiments of the disclosure, other forces may be applied which may cause other deformations of the apparatus 1. For example, the user may apply a force which extends in a downward direction to each end of the apparatus 1 which may cause the further substrate 43 to bend so that the surface 49 is concave and the substrate 3 to bend so that the surface 9 is convex.

In the examplary embodiment of FIG. 8B the forces applied by the user have not caused the supports 5 or the further supports 45 to be deformed. In particular the supports 5 and the further supports 45 have not been compressed which has not reduced the separation between the conductive portion 7 and the substrate 3 and further substrate 49. This may enable the conductive portion 7 to avoid coming into direct contact with the substrate 3 or further substrate 43 when the apparatus 1 is bent as illustrated in FIG. 8B.

Figure 8C:
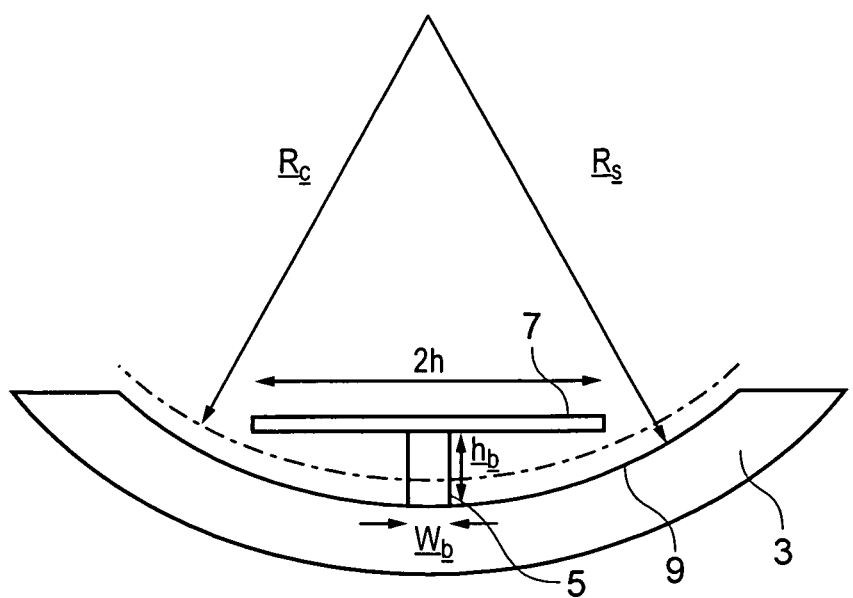

FIG. 8C illustrates relative dimensions of the respective components of the apparatus which may be used to avoid the conductive portion 7 coming into direct contact with the substrate 3 or further substrate 43 when the apparatus 1 is bent. FIG. 8C only illustrates the substrate 3, one support and the conductive portion 7 for clarity.

The support 5 has a height $h_b$ and a width $w_b$. The support may have a uniform cross section so that the support has the same height and width along the whole length of the support 5.

The conductive portion extends across a width of 2h where h is the depth of one of the loops 12. It is to be appreciated that the actual width of the conductive portion 7 may not be as large as 2h. The value of 2h may represent the sum of the distance between the furthest point of the conductive portion on the left hand side of the support 5 and the distance between the furthest point of the conductive portion on the right hand side of the support 5. The furthest point of the conductive portion on the left hand side of the support 5 and the furthest point of the conductive portion on the right hand side of the support 5 might not be directly opposite each other, for example, if the conductive portion has a serpentine structure as illustrated in FIG. 1.

When the apparatus 1 is in the flat equilibrium state the conductive portion 7 is spaced from the deformable substrate by the height of the support 5 $h_b$.

In FIG. 8B the substrate 3 has been deformed to have a radius of curvature given by $R_s$. Provided that $R_s$ is less than the critical radius of curvature $R_c$ the conductive portion 7 will not come into contact with the substrate 3.

Figure 9A:
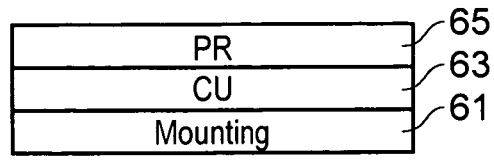
FIGS. 9A to 9D illustrate a method of manufacturing an apparatus 1 according to embodiments of the disclosure.
Figure 9B:
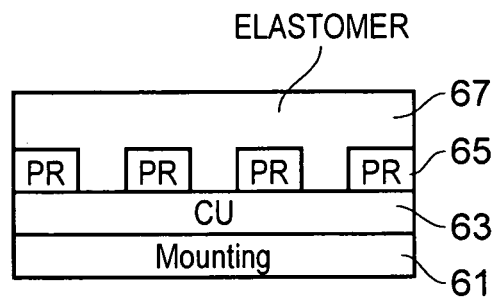

FIGS. 9A to 9B illustrate a method of manufacturing an apparatus 1 according to embodiments of the disclosure.

In FIG. 9A a layer of conductive material 63 is provided on a mounting 61. In the examplary embodiment of FIG. 9A the conductive material 63 comprises copper. It is to be appreciated that other conductive materials 63 such as gold or silver could be used in other embodiments of the disclosure.

A layer of photo resist 65 is provided on top of the layer of conductive material. The layer of photo resist 65 may comprise any suitable material such as PMMA (Poly(methyl methacrylate)) or any other suitable photo resist material.

In FIG. 9B the at least one support 5 is formed by creating strips of elastomer 67 within the layer of photo resist 65. In some embodiments of the disclosure the strips of elastomers may be formed by casting liquid polymer or by hot rolling films of elastomer such as polyurethane (PU). The deformable substrate 3 is formed by providing a layer of the elastomers 67. The elastomer may comprise any suitable material such as PDMS (polydimethylsiloxane) or other suitable silicone compound, polyurethane (PU) or elastomers.

Figure 9C:
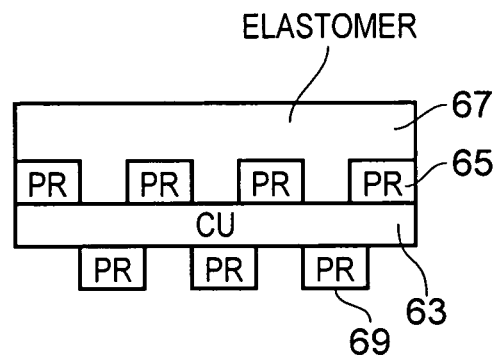

In FIG. 9C the mounting 61 is removed and a further layer of photo resist 69 is provided. The further layer of photo resist 69 is provided on the other side of the layer of conductive material 63 to the first layer of photo resist 65. The further layer of photo resist 69 allows for patterning of the layer of conductive material 63.

Figure 9D:
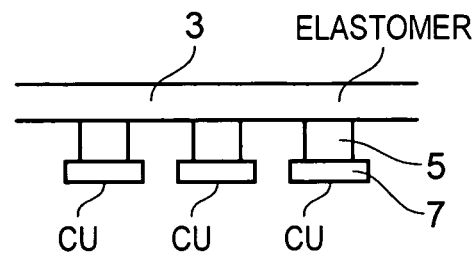

In FIG. 9D the layers of photo resist 65, 69 are removed leaving a conductive portion 7 mounted on an elastomeric substrate 3 via a plurality of supports 5 to provide an apparatus 1 as described above.

It is to be appreciated that the method of manufacturing the apparatus 1 illustrated in FIGS. 9A to 9B is examplary and other methods may be used in other embodiments of the disclosure.

In the embodiments described above the term "coupled" means operationally coupled and any number or combination of intervening elements may exist between coupled components (including no intervening elements).

Although embodiments of the present disclosure have been described in the preceding paragraphs with reference to various examples, it should be appreciated that modifications to the examples given can be made without departing from the scope of the disclosure as claimed.

Features described in the preceding description may be used in combinations other than the combinations explicitly described.

For example it is to be appreciated that different shapes of conductive portion 7 can be used in different implementations of the disclosure. The shape of the conductive portion used may be dependent on a number of factors including the size of the apparatus, the thickness or other dimensions of the conductive portion and properties of the conductive portion such as the Young's modulus.

Although functions have been described with reference to certain features, those functions may be performable by other features whether described or not.

Although features have been described with reference to certain embodiments, those features may also be present in other embodiments whether described or not.

Whilst endeavouring in the foregoing specification to draw attention to those features of the disclosure believed to be of particular importance it should be understood that the Applicant claims protection in respect of any patentable feature or combination of features hereinbefore referred to and/or shown in the drawings whether or not particular emphasis has been placed thereon.

I/We claim:

1. An apparatus comprising:
    a deformable substrate;
    a conductive portion; and
    at least one support configured to couple the conductive portion to the deformable substrate so that:
    the conductive portion is spaced from the deformable substrate;
    the conductive portion does not directly contact the deformable substrate when the apparatus is in a deformed state; and
    a force applied to the deformable substrate does not cause the deformable substrate and the conductive portion to bend or change size or shape in the same way.

2. An apparatus as claimed in claim 1 wherein the conductive portion is curved.

3. An apparatus as claimed in claim 2 wherein a radius of curvature of the conductive portion is parallel to a plane of the deformable substrate.

4. An apparatus as claimed in claim 1 wherein the conductive portion comprises at least one deformable portion.

5. An apparatus as claimed in claim 1 wherein the conductive portion comprises at least one rigid portion.

6. An apparatus as claimed in claim 1 wherein the conductive portion comprises at least one of a wire, a plurality of wires or a flexible printed circuit board.

7. An apparatus as claimed in claim 1 wherein the deformable substrate is configured to be deformed in response to a force applied by a user.

8. An apparatus as claimed in claim 7 wherein deforming the deformable substrate comprises at least one of bending at least a portion of the deformable substrate or stretching at least a portion of the deformable substrate.

9. An apparatus as claimed in claim 1 comprising a further deformable substrate and wherein the further deformable substrate is arranged on an opposite side of the conductive portion to the deformable substrate.

10. An apparatus as claimed in claim 1 wherein the apparatus comprises a plurality of supports.

11. An apparatus as claimed in claim 1 wherein the conductive portion is coupled to the at least one support at a plurality of different points.

12. A method comprising:
    coupling a conductive portion to a deformable substrate using at least one support such that:
        the conductive portion is spaced from the deformable substrate;
        the conductive portion does not directly contact the deformable substrate when the apparatus is in a deformed state; and
        a force applied to the deformable substrate does not cause the deformable substrate and the conductive portion to bend or change size or shape in the same way.

13. A method as claimed in claim 12 wherein the conductive portion is curved.

14. A method as claimed in claim 13 comprising coupling the conductive portion to the deformable substrate such that a radius of curvature of the conductive portion is parallel to a plane of the deformable substrate.

15. A method as claimed in claim 12 wherein the conductive portion comprises at least one deformable portion.

16. A method as claimed in claim 12 wherein the conductive portion comprises at least one rigid portion.

17. A method as claimed in claim 12 wherein the conductive portion comprises at least one of, a wire, a plurality of wires or a flexible printed circuit board.

18. A method as claimed in claim 12 wherein the deformable substrate is configured to be deformed in response to a force applied by a user.

19. A method as claimed in claim 18 wherein deforming the deformable substrate comprises at least one of bending at least a portion of the deformable substrate or stretching at least a portion of the deformable substrate.

20. A method as claimed in claim 12 further comprising configuring a further deformable substrate on an opposite side of the conductive portion to the deformable substrate.

* * * * *